United States Patent
Seo et al.

(10) Patent No.: US 8,310,859 B2
(45) Date of Patent: Nov. 13, 2012

(54) SEMICONDUCTOR MEMORY DEVICE HAVING BALANCING CAPACITORS

(75) Inventors: Hyeoung-won Seo, Yongin-si (KR); Soo-ho Shin, Yongin-si (KR); Won-woo Lee, Yongin-si (KR); Jeong-soo Park, Yongin-si (KR); Young-yong Byun, Seoul (KR); Seong-jin Jang, Seongnam-si (KR); Sang-woong Shin, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 404 days.

(21) Appl. No.: 12/570,159

(22) Filed: Sep. 30, 2009

(65) Prior Publication Data

US 2010/0080044 A1  Apr. 1, 2010

(30) Foreign Application Priority Data

Sep. 30, 2008  (KR) .................. 10-2008-0095896
Oct. 23, 2008  (KR) .................. 10-2008-0104260

(51) Int. Cl.
*G11C 11/24* (2006.01)

(52) U.S. Cl. ........................................ 365/149; 365/205
(58) Field of Classification Search ................ None
See application file for complete search history.

(56) References Cited

U.S. PATENT DOCUMENTS

| 4,734,890 A * | 3/1988 | Miyatake et al. ............. 365/149 |
| 5,406,512 A * | 4/1995 | Kagenishi ..................... 365/149 |
| 5,608,668 A * | 3/1997 | Zagar et al. .................. 365/149 |
| 5,715,199 A * | 2/1998 | Kim .......................... 365/189.09 |
| 5,901,078 A * | 5/1999 | Porter et al. ................. 365/149 |
| 6,188,095 B1 | 2/2001 | Hieke |
| 7,054,210 B2 * | 5/2006 | Lee ............................... 365/203 |
| 2002/0085434 A1 | 7/2002 | Mandelman et al. |

FOREIGN PATENT DOCUMENTS

| KR | 20000051419 A | 8/2000 |
| KR | 20010093742 A | 10/2001 |
| KR | 20080023521 A | 3/2008 |

* cited by examiner

*Primary Examiner* — Alexander Sofocleous
(74) *Attorney, Agent, or Firm* — Volentine & Whitt, PLLC

(57) ABSTRACT

A semiconductor memory device includes a plurality of memory cell blocks including a first memory cell block having bit lines, an edge sense amplifier block including edge sense amplifiers coupled to a portion of the bit lines of the first memory cell block, and a balancing capacitor unit coupled to the edge sense amplifiers.

7 Claims, 8 Drawing Sheets

SEMICONDUCTOR MEMORY DEVICE HAVING BALANCING CAPACITORS

CROSS-REFERENCE TO RELATED APPLICATIONS

This application claims the benefit of Korean Patent Application Nos. 10-2008-0095896, filed on Sep. 30, 2008 and 10-2008-0104260, filed on Oct. 23, 2008 in the Korean Intellectual Property Office, the disclosures of which are incorporated by reference in their entireties for all purposes.

BACKGROUND

Inventive concepts exemplarily described herein relate to semiconductor memory devices, and more particularly, to semiconductor memory devices having balancing capacitors.

SUMMARY

According to some of the inventive concepts, a semiconductor memory device may include a plurality of memory cell blocks including bit lines, an edge sense amplifier block including edge sense amplifiers coupled to a portion of the bit lines of one of the memory cell blocks, and a balancing capacitor unit coupled to the edge sense amplifiers. The balancing capacitor unit may include balancing bit lines coupled to the edge sense amplifiers and balancing capacitors coupled to the balancing bit lines.

According to some additional inventive concepts, a semiconductor memory device may include a plurality of memory cell blocks including a first memory cell block, one or more sense amplifier blocks interposed between the memory cell blocks, each sense amplifier block including sense amplifiers coupled to bit lines of adjacent memory cell blocks, a first edge sense amplifier block adjacent to the first memory cell block and comprising first edge sense amplifiers coupled to bit lines of the first memory cell block, and a balancing capacitor unit including balancing capacitors and balancing bit lines connected to the edge sense amplifiers, wherein the edge sense amplifiers have a greater sensing property than sense amplifiers in the one or more sense amplifier blocks. The edge sense amplifiers may have larger transistors than sense amplifiers in the one or more sense amplifier blocks.

According to some additional inventive concepts, a semiconductor memory device may include a plurality of memory cell blocks including a first memory cell block having bit lines, one or more sense amplifier blocks interposed between the memory cell blocks and comprising sense amplifiers coupled to bit lines of adjacent memory cell blocks, an edge sense amplifier block adjacent to the first memory cell block and comprising edge sense amplifiers coupled to a portion of the bit lines of the first memory cell block, and a balancing capacitor unit including balancing bit lines coupled to the edge sense amplifiers and balancing capacitors coupled to the balancing bit lines, wherein the balancing capacitors are arranged in a direction perpendicular to the balancing bit lines.

BRIEF DESCRIPTION OF THE DRAWINGS

Exemplary embodiments of the inventive concepts will be more clearly understood from the following detailed description taken in conjunction with the accompanying drawings in which.

DETAILED DESCRIPTION

Figure 1:
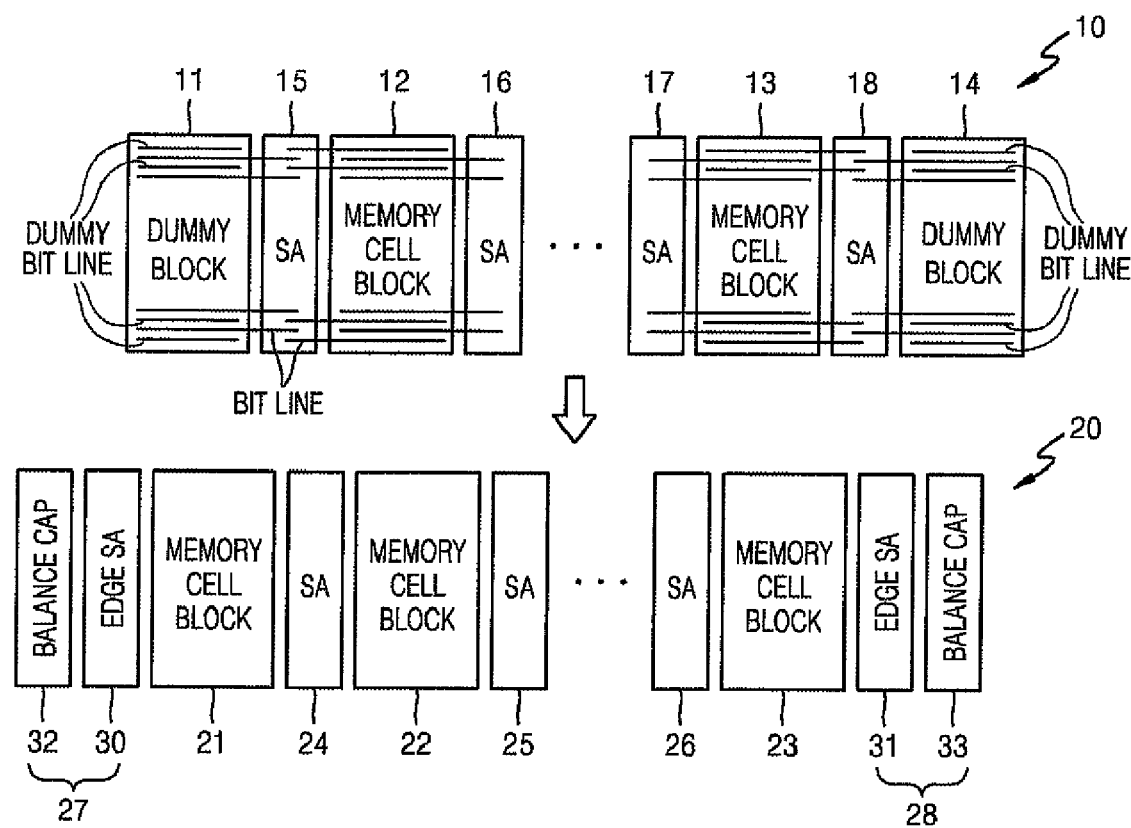
FIG. 1 illustrates a semiconductor memory device according to an embodiment of the inventive concepts.

FIG. 1 illustrates a semiconductor memory device according to an embodiment of the inventive concepts. In FIG. 1, a memory cell array 10 having a general open bit line structure is compared with a memory cell array 20 in an open bit line structure according to an embodiment of the inventive concepts. The memory cell array 10 having a general open bit line structure includes a plurality of memory cell blocks 11, 12, 13, and 14 and a plurality of sense amplifiers 15, 16, 17, and 18 interposed between the memory cell blocks 11, 12, 13, and 14. In the memory cell blocks 11, 12, 13, and 14, DRAM cells having one transistor and one capacitor each are arranged at the intersections of word lines and bit lines. In the memory cell blocks 11 and 14, which are disposed at the edges of the memory cell array 10, half of the bit lines are connected to the sense amplifiers 15 and 18, and the other half of the bit lines remain as dummy lines.

The memory cell array 20 having an open bit line structure according to an embodiment of the inventive concepts includes a plurality of memory cell blocks 21, 22, and 23 with DRAM cells having one transistor and one capacitor each arranged at the intersections of word lines and bit lines. In one embodiment, the memory cell array 20 has an open bit line structure in which the plurality of memory cell blocks 21, 22, and 23 include DRAM cells having one transistor and one capacitor arranged at substantially all the intersections of word lines and bit lines. A plurality of sense amplifiers 24, 25, and 26 are interposed between the memory cell blocks 21, 22, and 23. The memory cell blocks 21 and 23 disposed at edges of the memory cell array 20 are connected to edge sense amplifier blocks 27 and 28, respectively. The edge sense amplifier blocks 27 and 28 include edge sense amplifiers 30 and 31 and balancing capacitor units 32 and 33, respectively.

The edge sense amplifiers 30 and 31 are connected to half of the bit lines (referred to in this embodiment as the "bit lines") within the memory cell blocks 21 and 23. When memory cell data connected to the bit lines is sensed, the edge sense amplifiers 30 and 31 are connected to balancing capacitors through balancing bit lines (referred to in this embodiment as "complementary bit lines") to provide balancing reference voltage levels. If the capacitance of the bit lines is different from the capacitance of the complementary bit lines, bit line precharge noise is generated in the edge sense amplifiers 30 and 31 and thus the sensing operation is interrupted. Accordingly, in order to uniformly match the capacitance of the bit lines with the capacitance of the complementary bit lines, the balancing capacitors are connected to the complementary bit lines.

Figure 2:
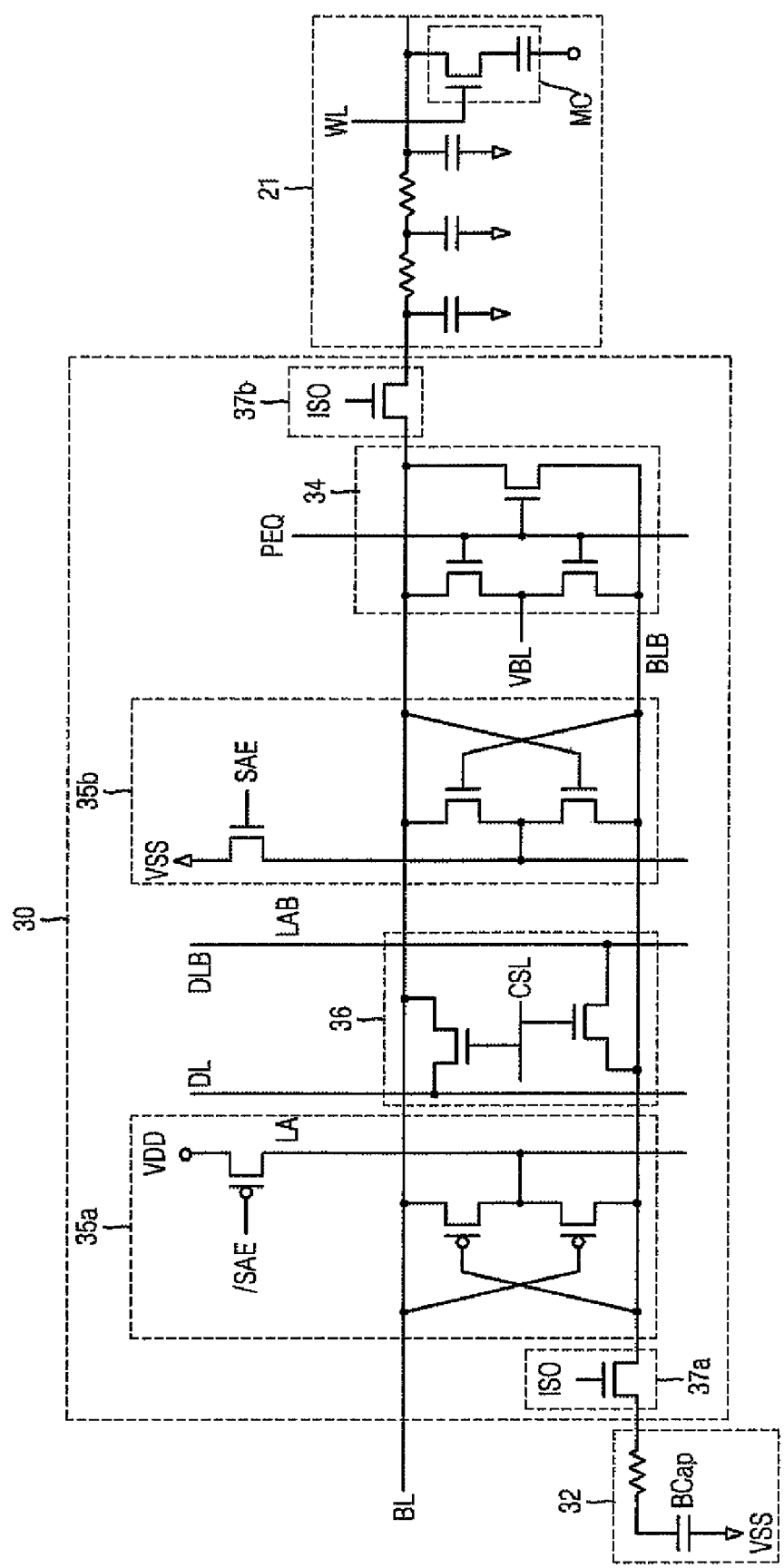
FIG. 2 illustrates an example of an edge sense amplifier of FIG. 1 according to an embodiment of the inventive concepts.

FIG. 2 illustrates an example embodiment of the edge sense amplifier 30 of FIG. 1. Referring to FIG. 2, the edge sense amplifier 30 includes an equalizer unit 34, first and second sensing units 35a and 35b, respectively, a data line selecting unit 36, and first and second isolation units 37a and 37b, respectively. The edge sense amplifier 30 is substantially the same as the edge sense amplifier 31. In response to an equalizing signal PEQ, the equalizer unit 34 precharges a bit line BL and a complementary bit line BLB to the bit line precharge voltage VBL. In response to sensing enable signals SAE and /SAE, the first and second sensing units 35a and 35b sense and amplify the memory cell (MC) data from the memory cell block 21 connected to the selected word line WL.

The first sensing unit 35a is connected to a first power source line LA driven by power source voltage VDD and includes PMOS transistors cross-linked at the bit line BL and the complementary bit line BLB. The second sensing unit 35b is connected to a second power source line LAB driven by ground voltage VSS and includes NMOS transistors cross-linked at the bit line BL and the complementary bit line BLB. In response to a column selection signal CSL, the data line selecting unit 36 transmits data from the pair of bit lines BL and BLB to a pair of data lines DL and DLB. In response to an isolation signal ISO, the first and second isolation units 37a and 37b respectively block the connections between the first and second sensing units 35a and 35b and the bit line BL, and between the first and second sensing units 35a and 35b and the complementary bit line BLB. The edge sense amplifier 30 may be substantially the same as a normal sense amplifier within the sense amplifier blocks 24, 25, and 26 of FIG. 1, except for the first and second isolation units 37a and 37b. The complementary bit line BLB is connected to a balancing capacitor BCap within the balancing capacitor unit 32. The balancing capacitor BCap will be described later in more detail with reference to FIG. 6.

Figure 3:
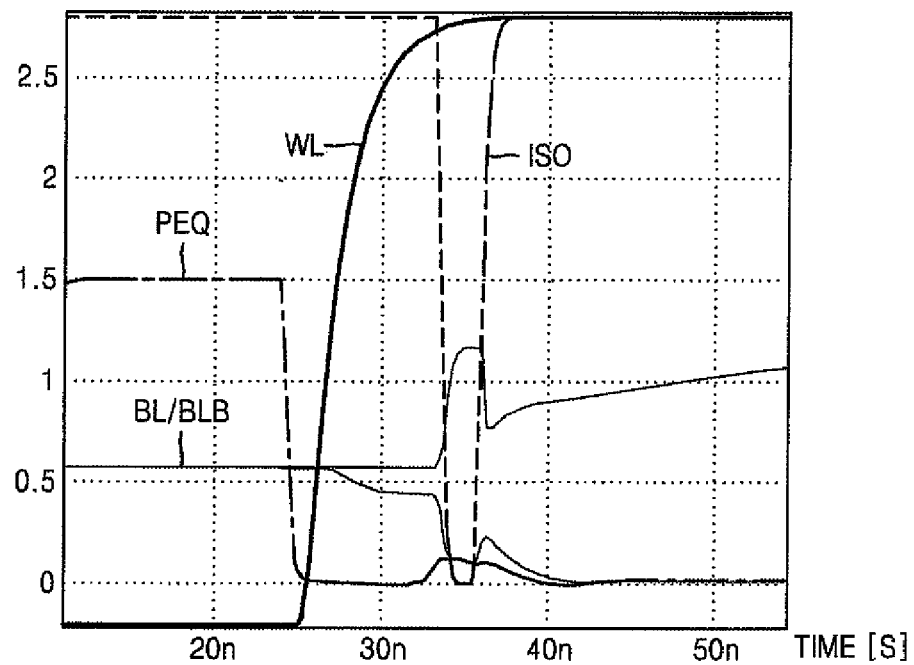
FIG. 3 is a timing diagram illustrating the operation of the edge sense amplifier of FIG. 2 according to an embodiment of the inventive concepts.
Figure 4:
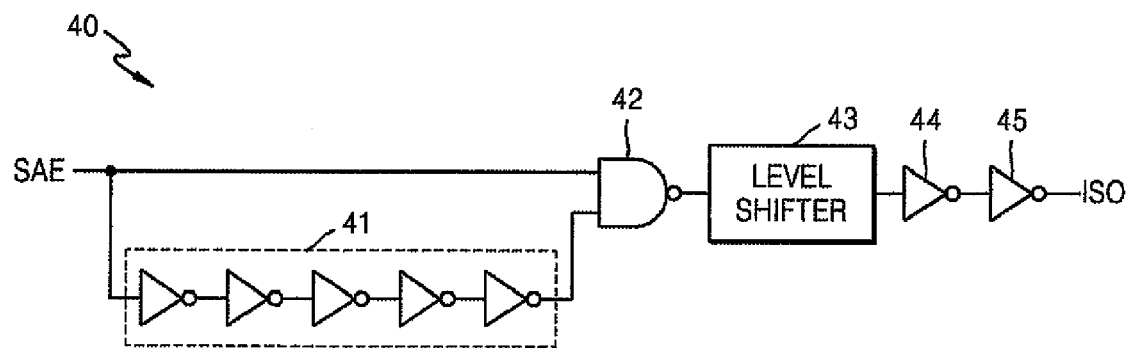
FIG. 4 is a circuit diagram illustrating a technique for generation of an isolation signal of FIG. 2 according to an embodiment of the inventive concepts.

FIG. 3 is a timing diagram illustrating the operation of the edge sense amplifier 30 of FIG. 2. Referring to FIG. 3, the bit line BL and the complementary bit line BLB are precharged to the precharge voltage VBL in response to a logic high level of the isolation signal ISO and a logic high level of the equalizing signal PEQ. Then, the selected word line WL is enabled, and the sensing enable signal SAE (not shown) is activated so that charge sharing with the bit line BL and the complementary bit line BLB is occurs, and thus a voltage difference develops between BL and BLB. The isolation signal ISO is driven to a logic low level during a pulse portion of the sensing operation, thereby isolating the edge sense amplifier 30 from the bit line in the memory cell block 21 and the complementary bit line in the balancing capacitor unit 32. FIG. 4 is a circuit diagram illustrating a technique to generate the isolation signal ISO of FIG. 2. Referring to FIG. 4, an isolation signal generating circuit 40 includes a delay unit 41, a NAND gate 42, a level shifter 43, and buffers 44 and 45. The delay unit 41 inverts and delays the sensing enable signal SAE, the NAND gate 42 receives the sensing enable signal SAE and the output of the delay unit 41, the level shifter 43 shifts the level of the output of the NAND gate 42, and the buffers 44 and 45 buffer the output of the level shifter 43 to output the isolation signal ISO. The isolation signal generating circuit 40 generates the isolation signal ISO in which a pulse having a width equal to the delay time of the delay unit 41 is generated at a logic low level after activating the sensing enable signal SAE to a logic high level.

Figure 5:
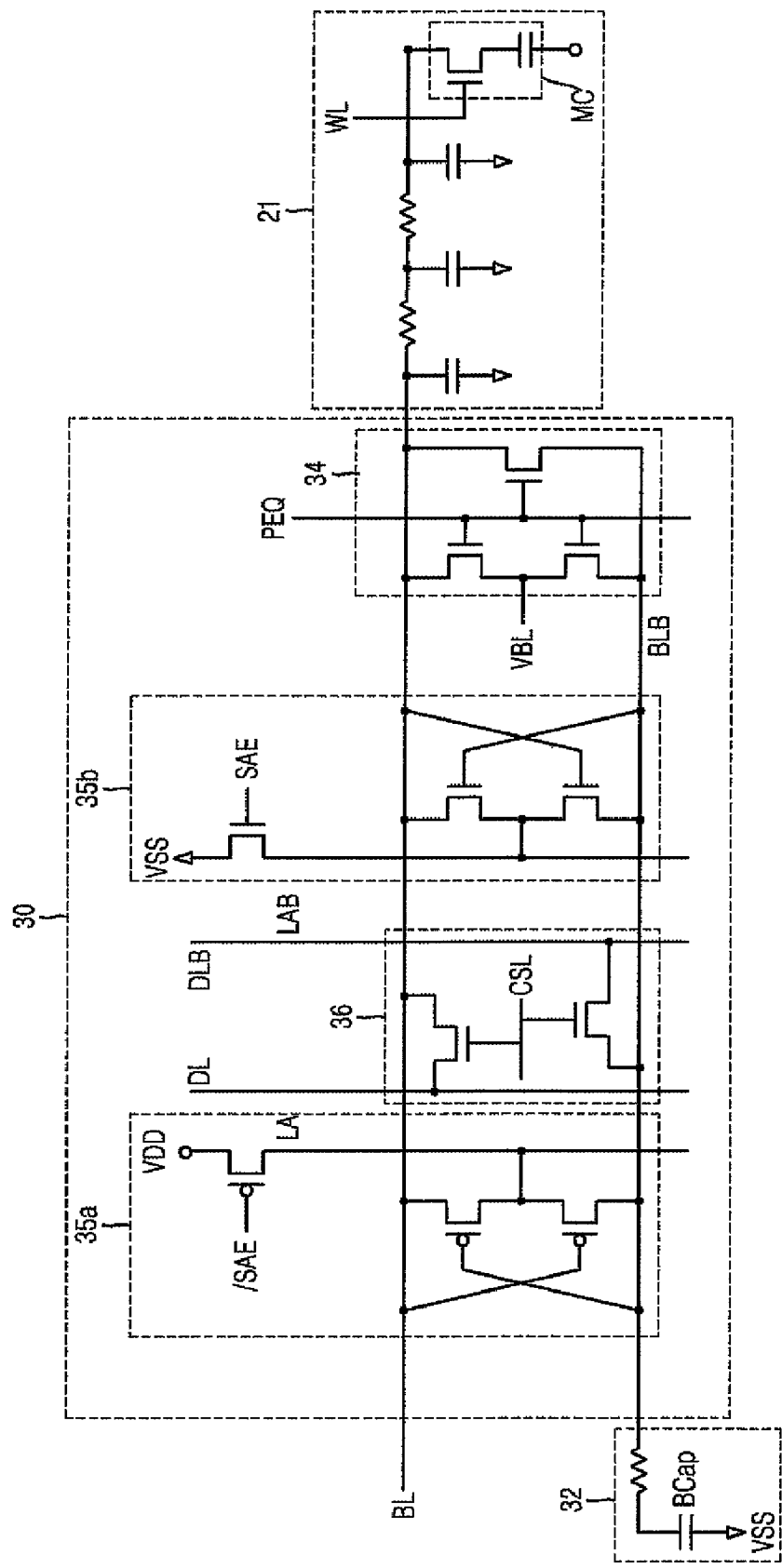
FIG. 5 illustrates another example of an edge sense amplifier of FIG. 1 according to an embodiment of the inventive concepts.

FIG. 5 illustrates another example embodiment of the edge sense amplifier 30 of FIG. 1. The edge sense amplifier 30 of FIG. 5 is different from the edge sense amplifier 30 of FIG. 2 in that the first and second isolation units 37a and 37b may be excluded from the edge sense amplifier 30 of FIG. 5. Also, in the embodiment of FIG. 5, the first and second sensing units may have greater sensing properties than those of the normal sense amplifiers 24, 25, and 26. For example, the sizes of the PMOS transistors and the NMOS transistors in the first and second sensing units 35a and 35b may be larger than those of the normal sense amplifiers 24, 25, and 26 so as to increase their sensing properties. Other elements in the edge sense amplifier 30 of FIG. 5 may be the same as those of the edge sense amplifier 30 of FIG. 2.

Figure 6:
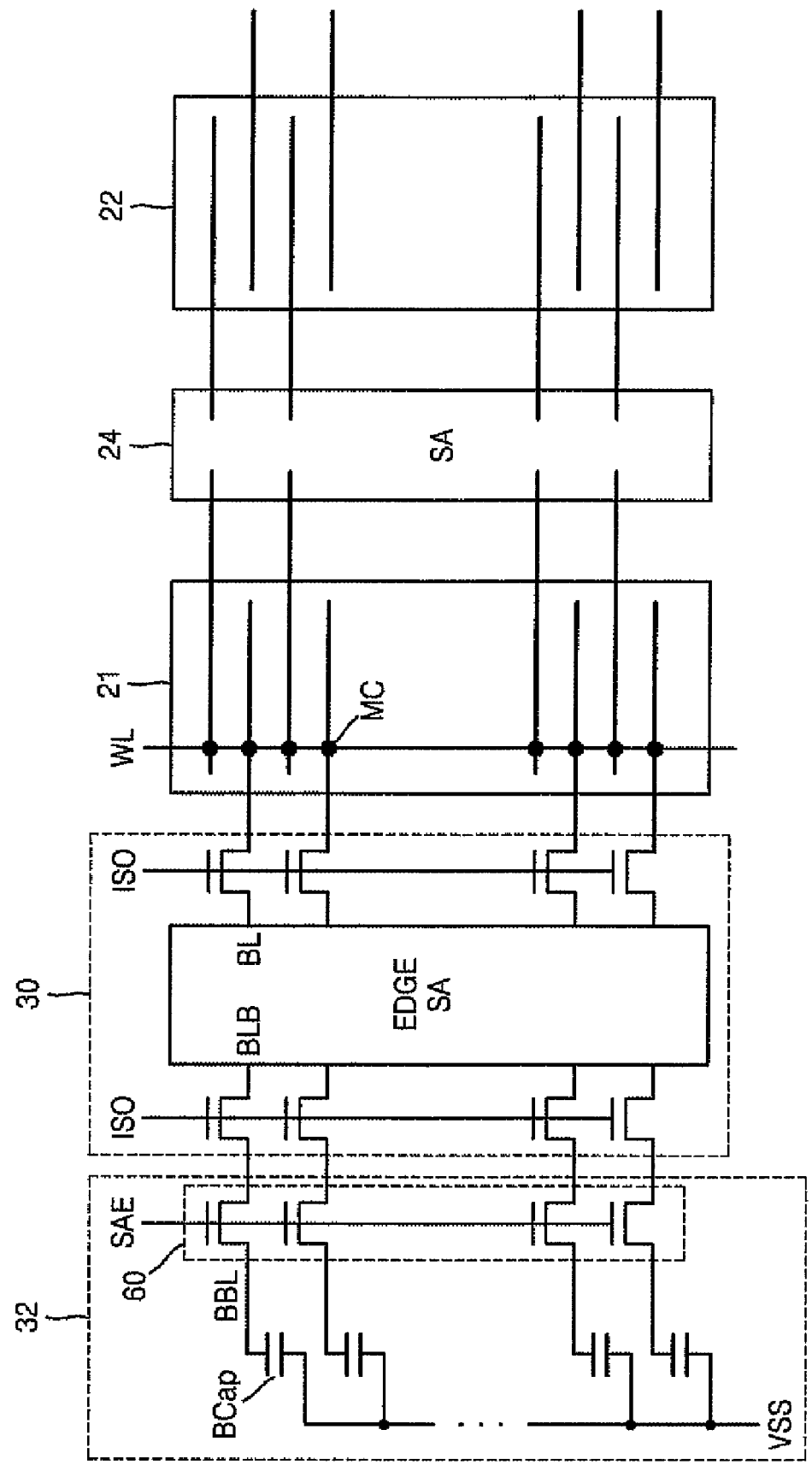
FIG. 6 illustrates an example of the balancing capacitor unit of FIG. 1 according to an embodiment of the inventive concepts.

FIG. 6 illustrates an example embodiment of the balancing capacitor unit 32 of FIG. 1 in more detail. Referring to FIG. 6, the balancing capacitor unit 32 includes balancing capacitors BCap and a switching unit 60, wherein each of the balancing capacitors BCap is connected between one of the balancing bit lines BBL and the voltage VSS. The switching unit 60 connects the balancing bit lines BBL with the complementary bit lines BLB of the edge sense amplifier 30 in response to the sensing enable signal SAE. The switching unit 60 includes NMOS transistors connected between the balancing bit lines BBL and the complementary bit lines BLB. The balancing capacitors BCap may be arranged as shown in FIG. 7.

Figure 7:
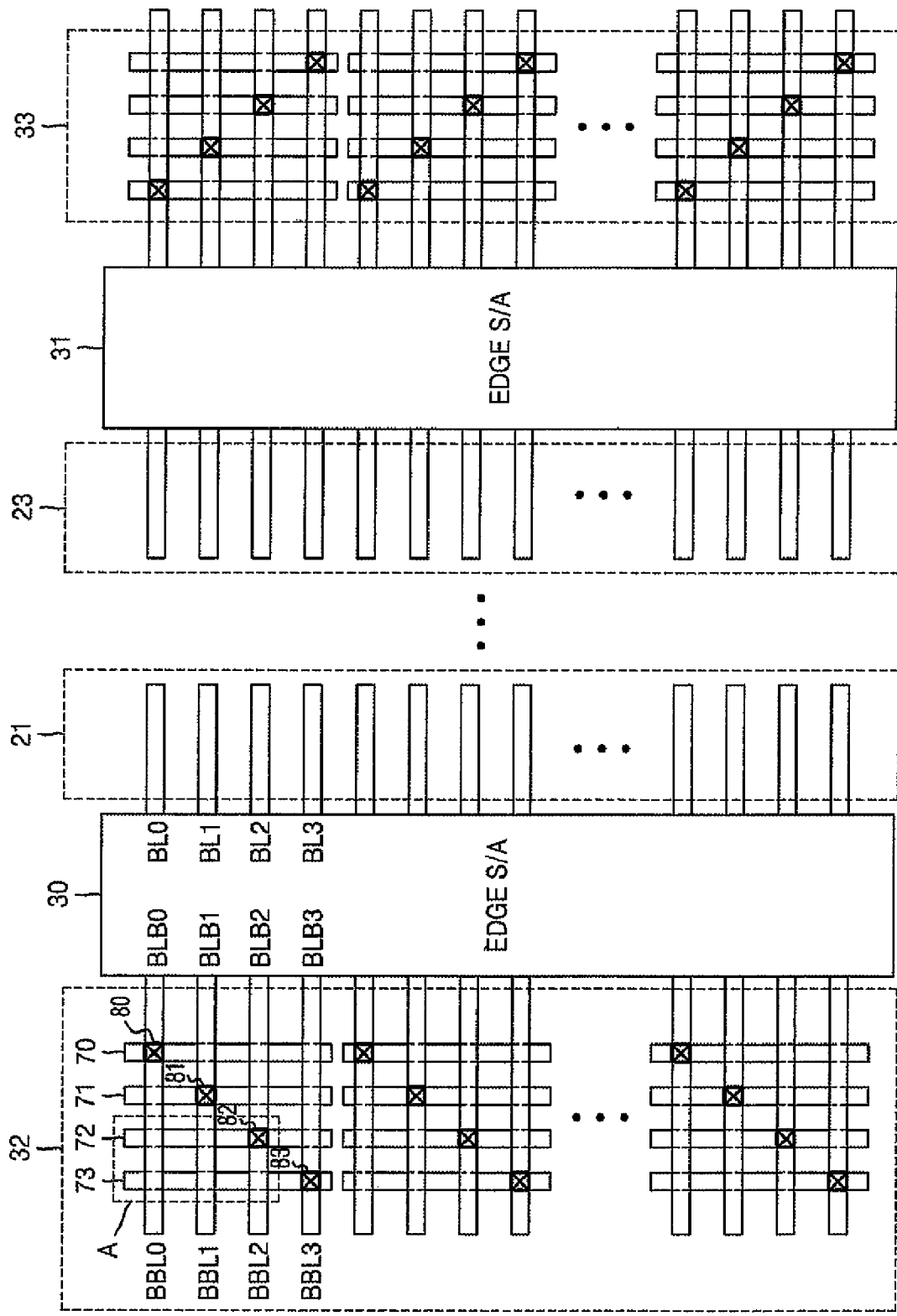
FIG. 7 illustrates an example arrangement of balancing capacitors included in the balancing capacitor unit of FIG. 1 according to an embodiment of the inventive concepts.

Referring to FIG. 7, the balancing bit lines BBL0-BBL3 in the balancing capacitor unit 32 are arranged in the same direction as the complementary bit lines BLB0-BLB3 of the edge sense amplifier 30. The balancing capacitors 70, 71, 72, and 73 are arranged in a direction perpendicular to the balancing bit lines BBL0-BBL3. The balancing capacitors 70, 71, 72, and 73 are connected to the balancing bit lines BBL0-BBL3 through contacts 80, 81, 82, and 83. In this embodiment, the balancing capacitors 70, 71, 72, and 73 are arranged in the same region as four balancing bit lines BBL0-BBL3. In regions where four balancing bit lines BBL0-BBL3 are arranged, the balancing capacitors 70, 71, 72, and 73 may have the same capacitance as the bit lines BL0-BL3 connected to the edge sense amplifier 30. The balancing capacitors 70, 71, 72, and 73 may be fabricated using a recess type capacitor structure which may increase the capacitance value per unit area depending on the type of structure. If a recess type capacitor structure is used, the balancing capacitors 70, 71, and 72 may be arranged in the same region as only three balancing bit lines BBL0-BBL2.

Figure 8:
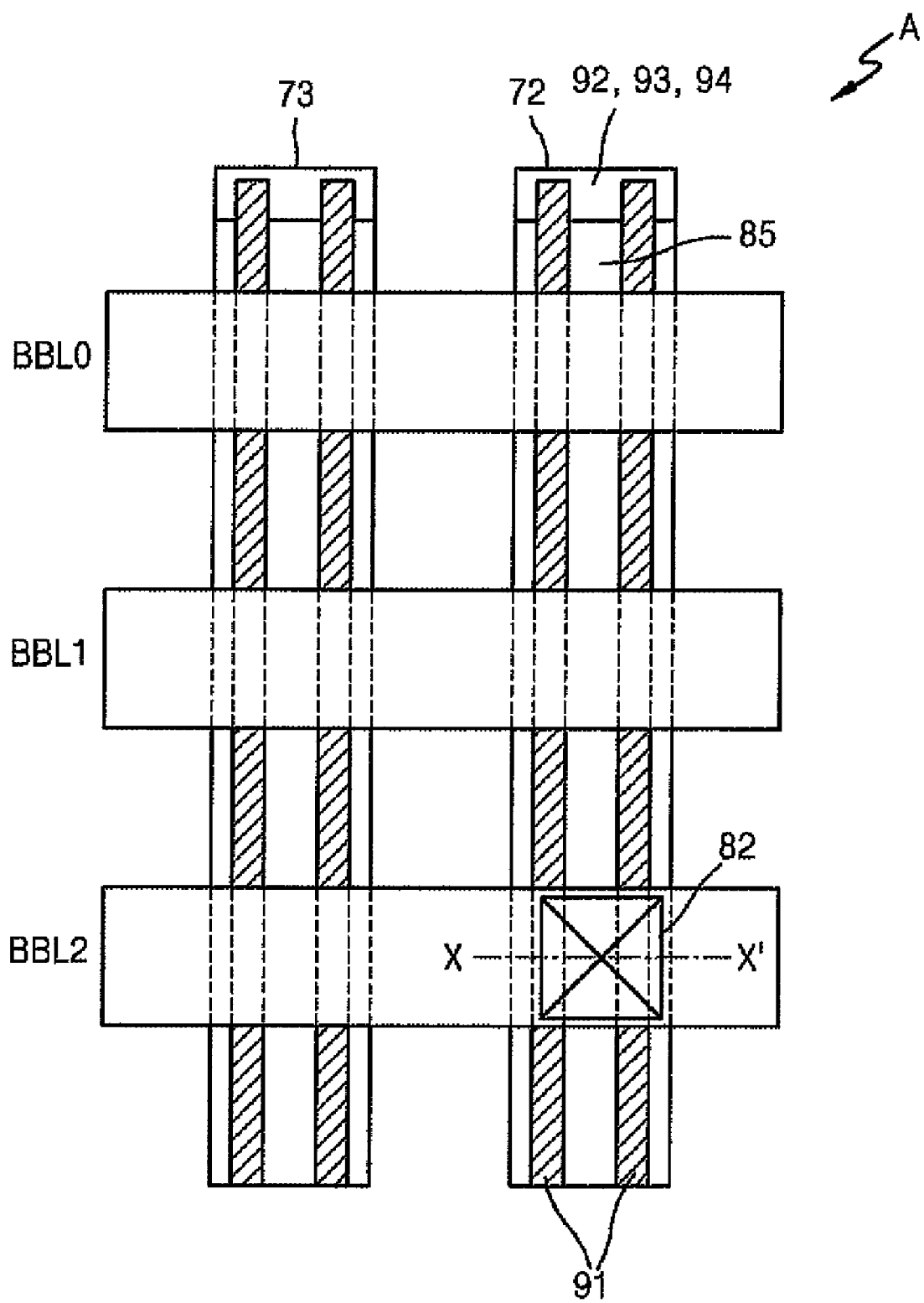
FIG. 8 is an enlarged view of portion A in the balancing capacitor unit of FIG. 7 according to an embodiment of the inventive concepts.
Figure 9:
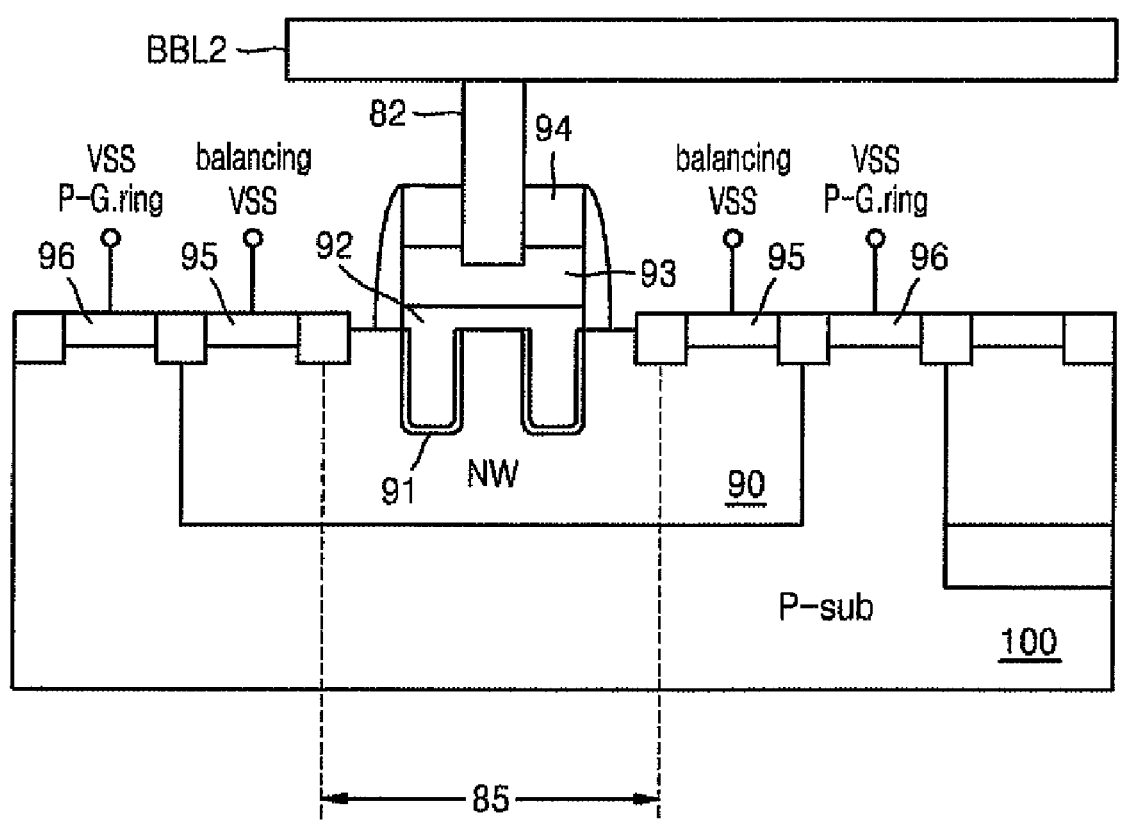
FIG. 9 is a cross-sectional view of the balancing capacitor of FIG. 8 taken along the line X-X' of FIG. 8 according to an embodiment of the inventive concepts.

FIG. 8 is an enlarged view of portion A of the balancing capacitor unit 32 of FIG. 7. Referring to FIG. 8, dielectric films 91 and first, second, and third upper conductive films 92, 93, and 94, respectively, are arranged on an active region 85 of the balancing capacitors 72 and 73. FIG. 9 is a cross-sectional view of the balancing capacitor of FIG. 8, which is taken along line X-X' shown in FIG. 8 and shows the contact 82 connecting the balancing capacitor 72 and the balancing bit line BBL2. Referring to FIG. 9, an N-well 90 is formed on a semiconductor substrate 100 having a first conductivity type (e.g., p-type). The N-well 90 functions as a lower conductive film of the balancing capacitor 72. Recess type dielectric films 91 are formed in the N-well 90 and a first upper conductive film 92 is formed on the dielectric films 91. The second and third upper conductive films 93 and 94 are sequentially formed on the first upper conductive film 92. The balancing bit line BBL2 is connected to the second upper conductive film 93 through the contact 82 which is filled with a conductive film material. The N-well 90 is biased to the ground voltage VSS through a N-plug 95 and the p-type semiconductor substrate 100 outside the N-well 90 is also biased to the ground voltage VSS through a P-plug 96.

While the inventive concepts has been particularly shown and described with reference to exemplary embodiments thereof, it will be understood that various changes in form and details may be made therein without departing from the spirit and scope of the following claims.

What is claimed is:

1. A semiconductor memory device comprising:
   a plurality of memory cell blocks including bit lines;
   an edge sense amplifier block including edge sense amplifiers coupled to a portion of the bit lines of one of the memory cell blocks, wherein the edge sense amplifiers are configured to be isolated in response to an isolation signal;
   a balancing capacitor unit including balancing bit lines coupled to the edge sense amplifiers, and balancing capacitors coupled to the balancing bit lines; and
   an isolation signal generating circuit to generate the isolation signal, wherein the isolation signal generating circuit comprises:
   a logic gate to receive a sensing enable signal,
   a level shifter to shift a level of an direct output of the logic gate; and
   a buffer coupled to a direct output of the level shifter to directly output the isolation signal.

2. The device of claim 1, wherein the edge sense amplifiers are coupled to half of the bit lines of the memory cell block.

3. The device of claim 1, wherein the memory cell blocks have an open bit line structure in which memory cells are arranged at substantially all intersections of word lines and bit lines.

4. The device of claim 1, wherein the balancing capacitors have a capacitance equal to a capacitance of the bit lines of the memory cell blocks.

5. The device of claim 1, wherein the edge sense amplifiers are configured to be isolated from the bit lines of the memory cell block and the balancing bit lines during a portion of a sensing operation.

6. The device of claim 5, wherein the edge sense amplifiers are configured to be isolated during a first portion of a time when the edge sense amplifiers are activated.

7. The device of claim 6, wherein the isolation signal generating circuit further comprises:
   a delay unit to invert and delay the sensing enable signal which activates the edge sense amplifiers;
   the logic gate to further receive an output of the delay unit.

* * * * *